(12) United States Patent
Kuo et al.

(10) Patent No.: US 7,549,073 B2
(45) Date of Patent: Jun. 16, 2009

(54) DYNAMIC ADJUSTING CIRCUIT FOR BASIC CLOCK SIGNAL OF FRONT-SIDE BUS AND METHOD THEREOF

(75) Inventors: Hung-Yi Kuo, Hsin-Tien (TW); Hui-Mei Chen, Hsin-Tien (TW)

(73) Assignee: Via Technologies Inc., Taipei County (TW)

( * ) Notice: Subject to any disclaimer, the term of this patent is extended or adjusted under 35 U.S.C. 154(b) by 459 days.

(21) Appl. No.: 11/450,406

(22) Filed: Jun. 12, 2006

(65) Prior Publication Data
US 2007/0074060 A1  Mar. 29, 2007

(30) Foreign Application Priority Data
Sep. 29, 2005  (TW) .............................. 94134019 A

(51) Int. Cl.
*G06F 1/04* (2006.01)
(52) U.S. Cl. .................... 713/500; 713/320; 713/322
(58) Field of Classification Search ................ 713/500, 713/320, 322
See application file for complete search history.

(56) References Cited

U.S. PATENT DOCUMENTS

| | | | | |
|---|---|---|---|---|
| 5,202,906 A * | 4/1993 | Saito et al. | .................... | 331/14 |
| 5,982,210 A * | 11/1999 | Rogers | ........................ | 327/156 |
| 6,173,025 B1 * | 1/2001 | Jokura | ........................ | 375/376 |
| 6,873,670 B1 * | 3/2005 | Chiu | .......................... | 375/375 |
| 6,907,535 B2 * | 6/2005 | Fang | .......................... | 713/322 |
| 7,242,230 B2 * | 7/2007 | Boyko et al. | ................. | 327/156 |
| 2001/0043122 A1 * | 11/2001 | Swoboda | ..................... | 331/18 |
| 2005/0125705 A1 * | 6/2005 | Cheng et al. | ................. | 713/322 |

* cited by examiner

*Primary Examiner*—Nitin C Patel
(74) *Attorney, Agent, or Firm*—Rosenberg, Klein & Lee

(57) ABSTRACT

By adjusting a scale factor of a phase locked loop in computers for generating a basic clock signal of a front-side bus, the frequency of the basic clock signal is modulated when the central processing unit of computers operates. By a bridge unit of the present invention, a selecting signal is received so as to output a corresponding adjustment signal to a check unit and then the check unit checks the adjustment signal for outputting a checking signal to a scale parameter adjustment unit. According to the checking signal, the scale parameter adjustment unit adjusts a first scale parameter of the scale factor that the phase locked loop uses now and outputs this parameter to the phase locked loop. Thus after receiving a fixed clock signal for generating the basic clock signal, the phase locked loop generates the basic clock signal of the front-side bus in accordance with the adjusted first scale parameter and further the frequency of the basic clock signal is adjusted.

20 Claims, 8 Drawing Sheets

| Basic Clock Signal f (MHz) | Fixed Clock Signal $f_0$ (MHz) | Numerator M | Denominator N | Adjustment Parameter $\triangle$ |
|---|---|---|---|---|
| 105 | 14.31818 | 733 | 100 | 7 |
| 104 | 14.31818 | 726 | 100 | 7 |
| 103 | 14.31818 | 719 | 100 | 7 |
| 102 | 14.31818 | 712 | 100 | 7 |
| 101 | 14.31818 | 705 | 100 | 7 |
| 100 | 14.31818 | 698 | 100 | 7 |
| 99 | 14.31818 | 691 | 100 | 7 |
| 98 | 14.31818 | 684 | 100 | 7 |
| 98 | 14.31818 | 677 | 100 | 7 |
| 96 | 14.31818 | 670 | 100 | 7 |
| 95 | 14.31818 | 663 | 100 | 7 |

Fig. 4

| Basic Clock Signal f (MHz) | Fixed Clock Signal $f_0$ (MHz) | Numerator M | Denominator N | Adjustment Parameter △ |
|---|---|---|---|---|
| 111 ~ 120 | 14.31818 | 775.24 ~ 838.10 | 100 | 6.98 |
| 101 ~ 110 | 14.31818 | 705.40 ~ 768.25 | 100 | 10.48 |
| 91 ~ 100 | 14.31818 | 635.56 ~ 698.41 | 100 | 13.97 |
| 81 ~ 90 | 14.31818 | 565.72 ~ 628.57 | 100 | 10.48 |
| 71 ~ 80 | 14.31818 | 495.87 ~ 558.73 | 100 | 6.98 |
| 61 ~ 70 | 14.31818 | 426.03 ~ 488.89 | 100 | 3.49 |

Fig. 8

DYNAMIC ADJUSTING CIRCUIT FOR BASIC CLOCK SIGNAL OF FRONT-SIDE BUS AND METHOD THEREOF

BACKGROUND OF THE INVENTION

The present invention relates to an adjusting circuit and method thereof, especially to a circuit and method thereof for adjusting dynamically frequency of the basic clock signal of the front-side bus when the central processing unit works.

Computer system is one of the most important technologies of last century. A lot of paperwork in companies is done by personnel manually and this is time-consuming and labor-intensive. Moreover, staffs of research and development department need to perform a lot experiments for designing new products. It takes a lot of time and labor to make the concepts or ideas feasible. Now due to the computers, administrative staffs do the paperwork easily and smoothly. The speed and efficiency are increased dramatically. Furthermore, the R&D staffs use computers to make simulations so as to speed up the development of new products. In addition, computers are also used to play music or movies for entertainment. It's not only a tool but also essentials of life. The invention of portable computers made people use computers more conveniently at any place, any time.

Although the portable computers are easy to carry, it gets problems on battery life. In order to extend the battery life, various designs are used to make the battery get optical efficiency. Moreover, central processing unit of the computer is one of the most power-consuming parts. Thus most of the methods for saving electricity depend on reducing the operation speed of the central processing unit so as to save electricity.

Refer to FIG. 1, a clock generator 10 of the computer includes a phase locked loop 12 that receives a fixed clock signal generated from a crystal oscillator 15 and produces a main clock signal according to a scale factor. The main clock signal is sent to a central processing unit 20 and a north bridge chip 30. This main clock signal is a basic clock signal of a front-side bus 33 between the central processing unit 20 and the north bridge chip 30 and its frequency is calculated by the following equation:

$$f = f_0 * M/N \quad (1)$$

f is frequency of the basic clock signal, $f_0$ is frequency of the fixed clock signal generated by the crystal oscillator 15, M and N respectively are numerator and denominator of the scale factor.

A phase locked loop 36 of the north bridge chip 30 receives a basic clock signal output from the phase locked loop 12 to generate operation clock signal for the front-side bus 33 so that the north bridge chip 30 controls operation of the front-side bus 33. A phase locked loop 25 of the central processing unit 20 also receives the basic clock signal output from the phase locked loop 12 to generate operation clock signal for the central processing unit 20. Thus the central processing unit 20 works according to this operation clock signal. Therefore, the speed of the central processing unit 20 can be adjusted by modulating frequency of the basic clock signal generated by the phase locked loop 12 of the clock generator 10.

Most of the methods for adjusting the basic clock signal available now uses software to drive an embedded controller 40 of portable devices, through a system management bus 45 to change value of the register inside the clock generator 10. Thus numerator and denominator of a scale factor of the phase locked loop 12 are changed and the phase locked loop 12 is driven to adjust the basic clock signal, However, such kind of methods are quite complicated with poor adjustment efficiency. Moreover, such methods of using the system management bus 45 can't be used in combination with operating systems of the computer. Thus it is not compatible with the software that is installed in the operating system for detecting load of the central processing unit 20. Therefore, such way can't automatically adjust the basic clock signal of the front-side bus 33 according to load of the central processing unit 20 and can't save electricity effectively.

Therefore, the present invention provides a circuit for adjusting basic clock signal of front-side bus and method thereof that not only improve disadvantages of conventional adjustment methods but also increase electricity-saving efficiency. Moreover, it can be used in combination with software installed in operating systems to adjust frequency of the basic clock signal of the front-side bus automatically according to load of the central processing unit for saving power.

SUMMARY OF THE INVENTION

The present invention provides a dynamic adjusting circuit for basic clock signal of front-side bus and method thereof that receiving a selecting signal by a bridge unit and outputting a corresponding adjustment signal to a clock generator. Thus the clock generator is driven to adjust basic clock signal of the front-side bus so as to achieve easy adjustment.

The present invention also provides a dynamic adjusting circuit for basic clock signal of front-side bus and method thereof that is used in combination with software detecting load of the central processing unit. Thus according to the load of central processing unit, the present invention automatically adjusts the basic clock signal of the front-side bus and further modulates the CPU speed so as to save power effectively.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 4 is a look-up table for adjusting basic clock signal of an embodiment in accordance with the present invention;

FIG. 8 is a look-up table for adjusting basic clock signal of another embodiment in accordance with the present invention.

DETAILED DESCRIPTION OF THE PREFERRED EMBODIMENT

Figure 1:
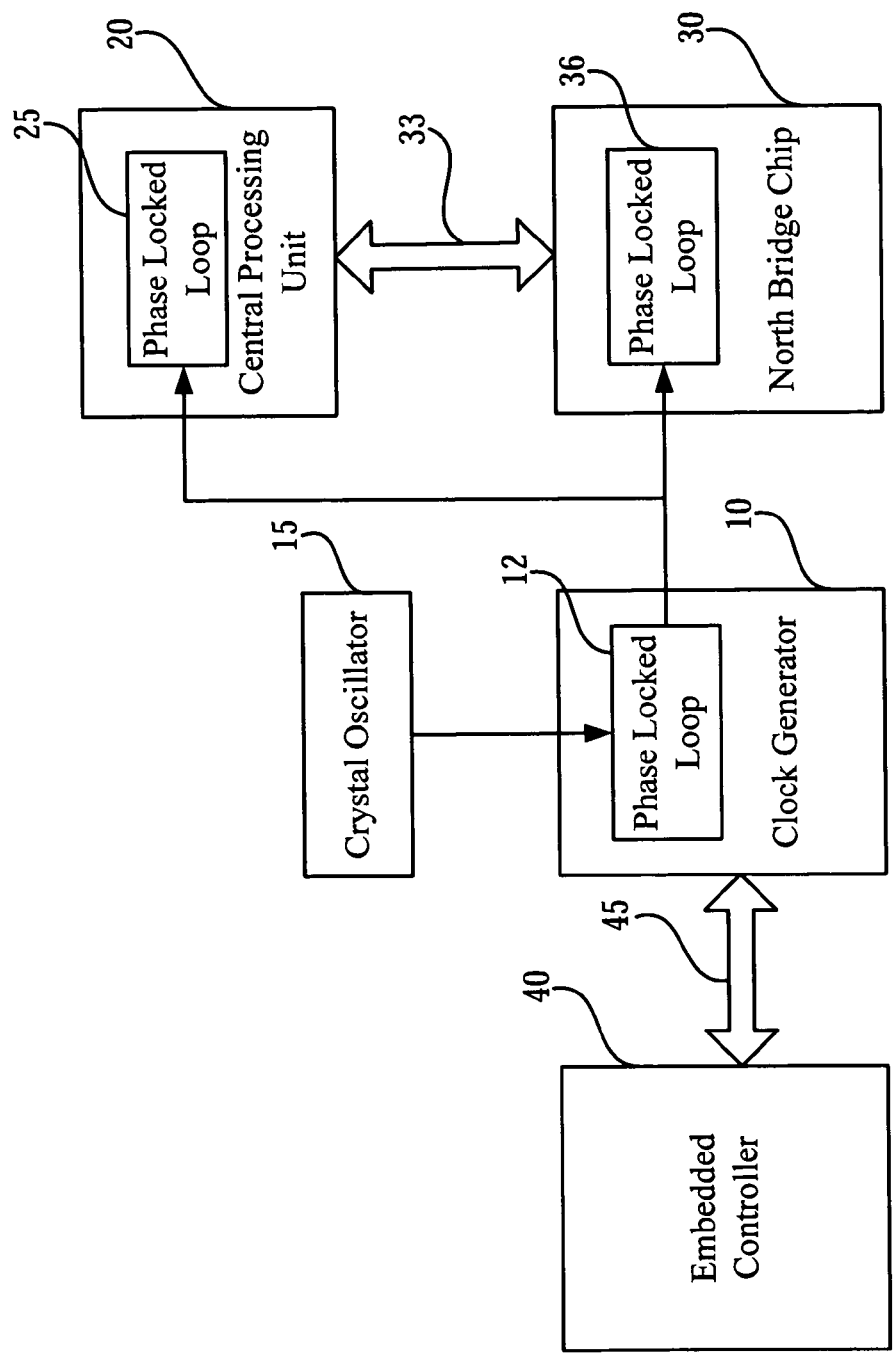
FIG. 1 is a block diagram showing conventional way of adjusting frequency of central processing unit.
Figure 2:
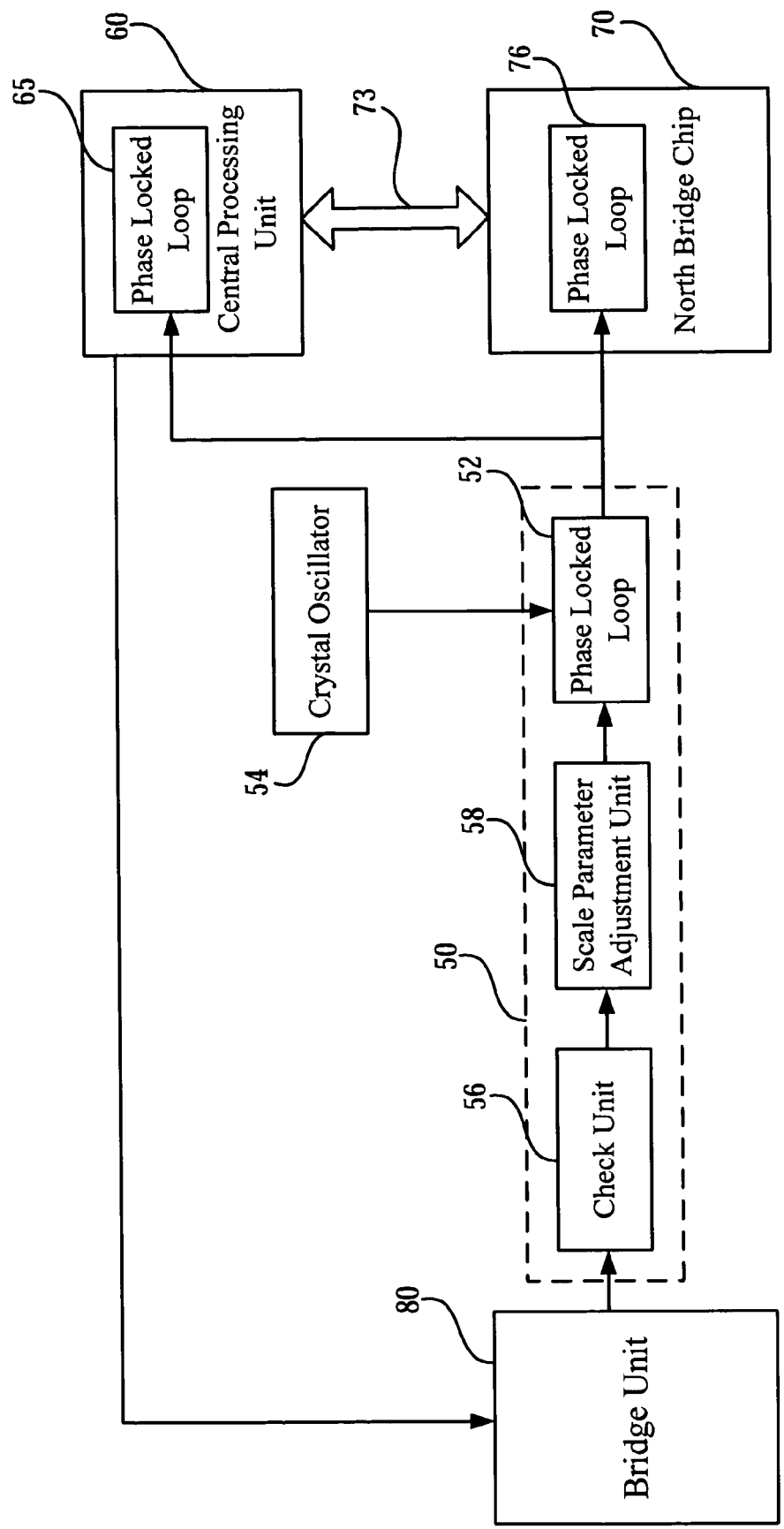
FIG. 2 is a block diagram of an embodiment in accordance with the present invention.

Refer to FIG. 2, a phase locked loop 52 of a clock generator 50 receives a fixed clock signal generated by a crystal oscillator 54 and generates a basic clock signal according to a scale factor (M/N) in the equation (1). The basic clock signal is sent to a phase locked loop 65 of a central processing unit 60 for generating an operation clock signal of the central processing unit 60. Moreover, the phase locked loop 52 also transmits the basic clock signal into a phase locked loop 76 of a north bridge chip 70 so as to generate an operation clock signal for a front-side bus 73 between the central processing unit 60 and the north bridge chip 70.

When the central processing unit 60 works, frequency of the basic clock signal output from the phase locked loop 52 is adjusted by adjusting the scale factor that is used to generate the basic clock signal by the phase locked loop 52 of the clock generator 50. The speed of the central processing unit 60 is further adjusted for reducing electricity consumed by the central processing unit 60 or increasing processing efficiency of the central processing unit 60. The dynamic adjustment circuit in accordance with the present invention includes a bridge unit 80, a check unit 56 and a scale parameter adjustment unit 58. The check unit 56 and the scale parameter adjustment unit 58 can be disposed on the clock generator 50, just like the phase locked loop 52.

Unlike conventional way of adjustment through a system management bus to adjust the basic clock signal, an embodiment of the present invention monitors and detects current workload of the central processing unit 60 by software of the computer. Then the central processing unit 60 is driven to send a selection signal to the bridge unit 80 for adjusting the basic clock signal. The software can be driving programs for central processing unit, operating system programs or power management programs. After receiving the selection signal, the bridge unit 80 correspondingly outputs an adjustment signal for frequency modulation to the check unit 56. Thus the check unit 56 checks and sends out a checking signal to the scale parameter adjustment unit 58 in response to the adjustment signal. The bridge unit 80 of the present invention is a south bridge chip of computers.

Figure 3:
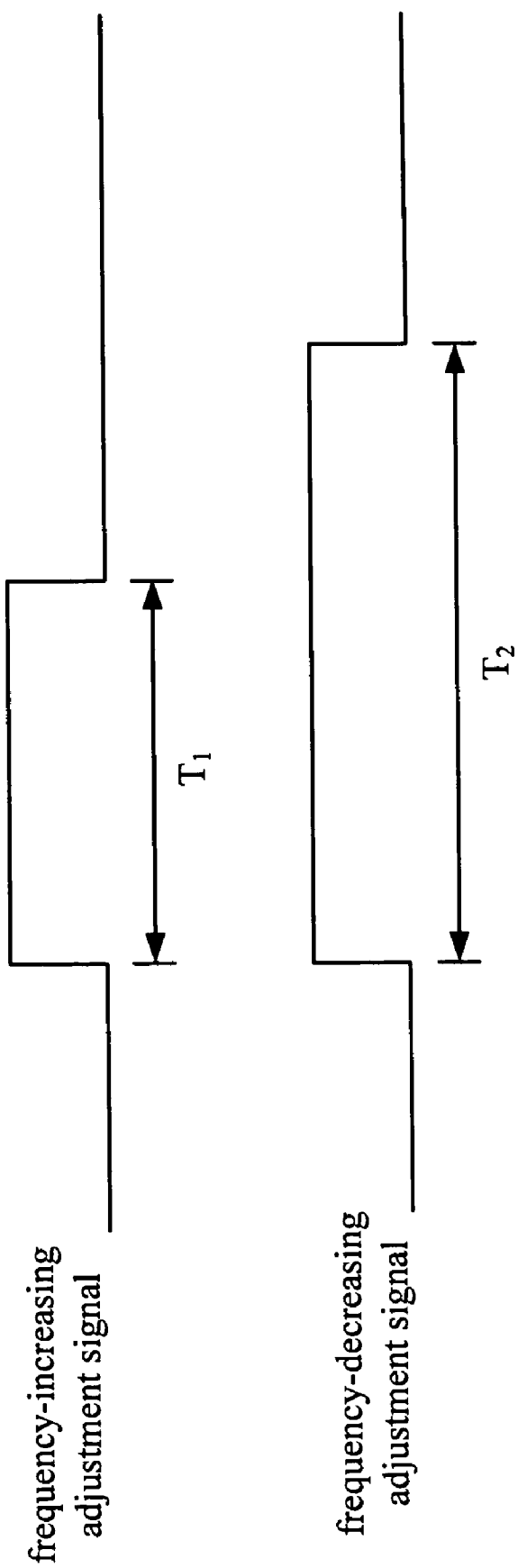
FIG. 3 is a waveform of an adjustment signal in accordance with the present invention.

The selection signal mentioned-above can be commands for reading/writing specific input/output port of the bridge unit 80. According to the specific input/output port being read or written, the bridge unit 80 outputs corresponding adjustment signals with various pulse width at an output pin, each represents respective frequency of basic clock signal intended to modulate. For example, while reading or writing the first input/output port of the bridge unit 80, the bridge unit 80 correspondingly outputs an adjustment signal for increasing frequency with bandwidth $T_1$, less than 300 ns, as shown in FIG. 3, representing increasing of the basic clock signal. When reading or writing the second input/output port of the bridge unit 80, the bridge unit 80 correspondingly outputs an adjustment signal for decreasing frequency with bandwidth $T_2$, larger than 500 ns, as shown in FIG. 3, so as to decrease the frequency of the basic clock signal.

When the bridge unit 80 sends an adjustment signal for increasing or decreasing frequency to the check unit 56, the check unit 56 checks whether the adjustment signal is for increasing frequency or for decreasing frequency according to the bandwidth of the adjustment signal and sends a corresponding checking signal to the scale parameter adjustment unit 58 so as to drive the scale parameter adjustment unit 58 to adjust the numerator M of the scale factor in equation (1). The adjusted numerator M is transmitted to the phase locked loop 52. Thus when the phase locked loop 52 receives the fixed clock signal from the crystal oscillator 54 for generating the basic clock signal of the front-side bus 73, it refers to the original denominator N and the numerator adjusted by the scale parameter adjustment unit 58 to generate the basic clock signal. Thus the frequency of the basic clock signal is modulated.

When the frequency generated by the phase locked loop 52 changes, the frequency of the operation clock signal from the phase locked loop 65 of the central processing unit 60 also changes along with the changed frequency of the received basic clock signal. Thus the speed of the central processing unit 60 is adjusted so as to reduce the power consumption or increase the efficiency thereof. The way of adjusting the numerator M of the scale factor in accordance with the present invention is to add or subtract the numerator M currently used by the phase locked loop 52 for generating the basic clock signal with a fixed adjustment parameter Δ so as to increase or decrease the numerator M for modulating the frequency of the basic clock signal.

Refer to the look-up table in FIG. 4 for explaining the adjusting way of the present invention, it is assumed that now the frequency of the fixed clock signal that the phase locked loop 52 receives is 14.31818 MHz and the numerator M as well as the denominator N is 698 and 100 respectively. Thus the frequency of the basic clock signal generated by the phase locked loop 52 is 100 MHz. When the check unit 56 receives a frequency-decreasing adjustment signal, it outputs a corresponding checking signal for decreasing frequency to the scale parameter adjustment unit 58. As shown in FIG. 4, the scale parameter adjustment unit 58 subtracts the two numbers—the numerator M (698) that the phase locked loop 52 uses now and the fixed adjustment parameter Δ (7) so as to have an adjusted numerator M (691) that is transmitted to the phase locked loop 52. Thus the phase locked loop 52 generates the basic clock signal according to the adjusted numerator M(691) and frequency of the basic clock signal generated now is lowered to 99 MHz. Therefore, the speed of the central processing unit 60 is reduced for saving power.

In similar way, when frequency of the basic clock signal is increased, add the two numbers—the numerator M (698) that the phase locked loop 52 uses now and the fixed adjustment parameter Δ (7) so as to have an adjusted numerator M (705) that is transmitted to the phase locked loop 52. Thus the phase locked loop 52 is driven to generate a basic clock signal with higher frequency of 101 MHz for increasing speed of the central processing unit 60. Moreover, the numerator M can be adjusted by a fixed-fold change. That means the frequency of the basic clock signal is increased/decreased in a fold at each adjustment. Furthermore, the frequency of the basic clock signal in accordance with the present invention is also adjusted by change of the denominator N.

In combination with system monitoring by software or firmware of computers, the loading of the central processing unit 60 is learned and thus the present invention 1 drives the central processing unit 60 to send a selecting signal to the bridge unit 80 that transmits a corresponding adjustment signal for frequency increasing/decreasing. Thus the frequency of the basic clock signal is modulated automatically so as to improve electricity-saving efficiency.

Figure 5:
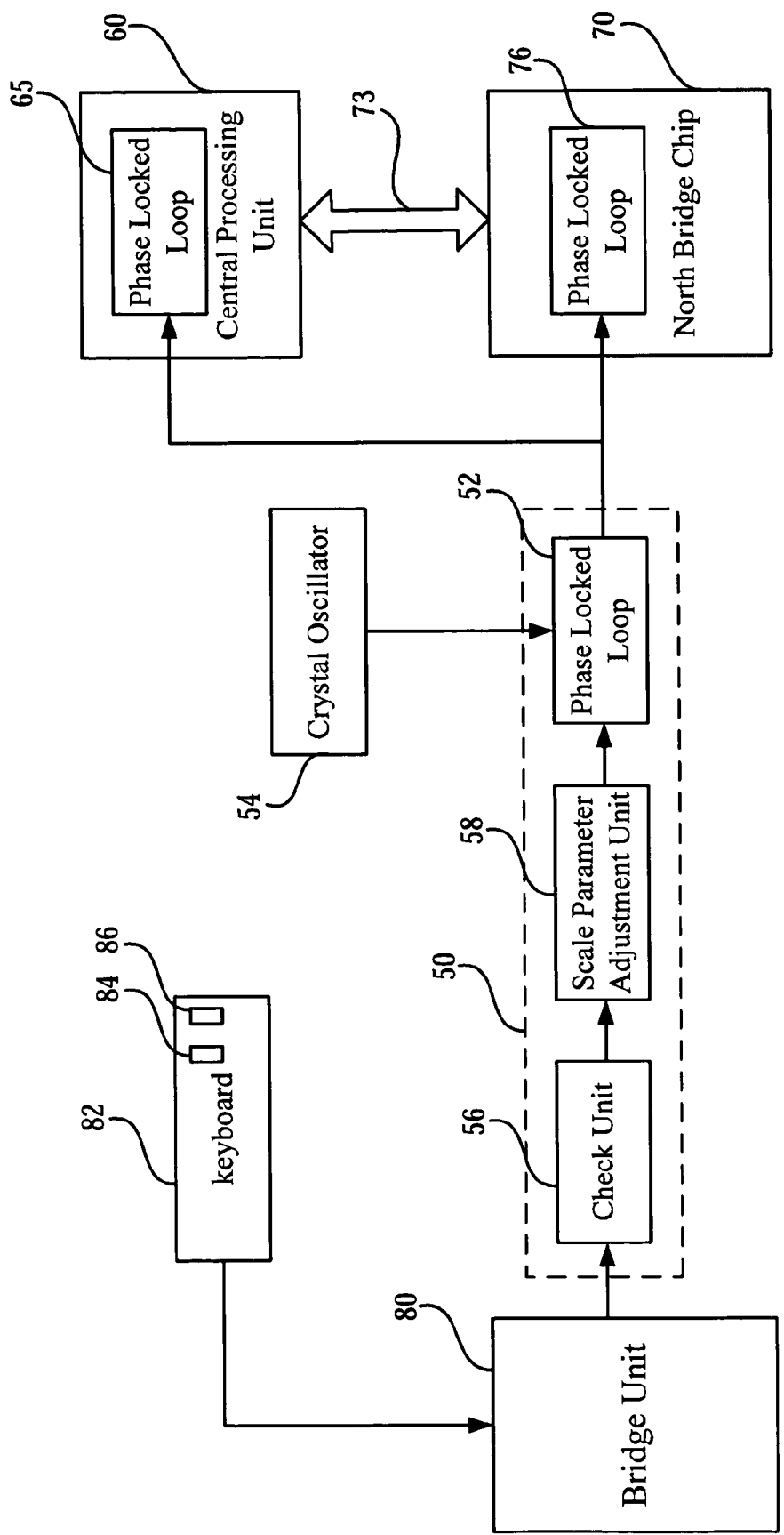
FIG. 5 is a block diagram of another embodiment in accordance with the present invention.

Refer to FIG. 5, another embodiment of the present invention is disclosed. By the present invention, users send a selecting signal to the bridge unit 80 for adjusting the basic clock signal through a user interface such as pressing the buttons or clicking the icons. A keyboard 82 is a user interface. According to the current conditions of computers, users press the buttons for adjustment 84, or 86 on the keyboard 82 to adjust the basic clock signal for increasing the operation efficiency or saving electricity of computers. For example, users press the buttons 84 for driving the keyboard 82 to send the selecting signal to the bridge unit 80. Then the bridge unit 80 correspondingly outputs the frequency-increasing adjustment signal with bandwidth $T_1$, less than 300 ns, as shown in FIG. 3, for increasing frequency of the basic clock signal. If users press the button 86, the bridge unit 80 is driven to output the frequency-decreasing adjustment signal with bandwidth $T_2$, larger than 500 ns, as shown in FIG. 3, for decreasing frequency of the basic clock signal.

Figure 6:
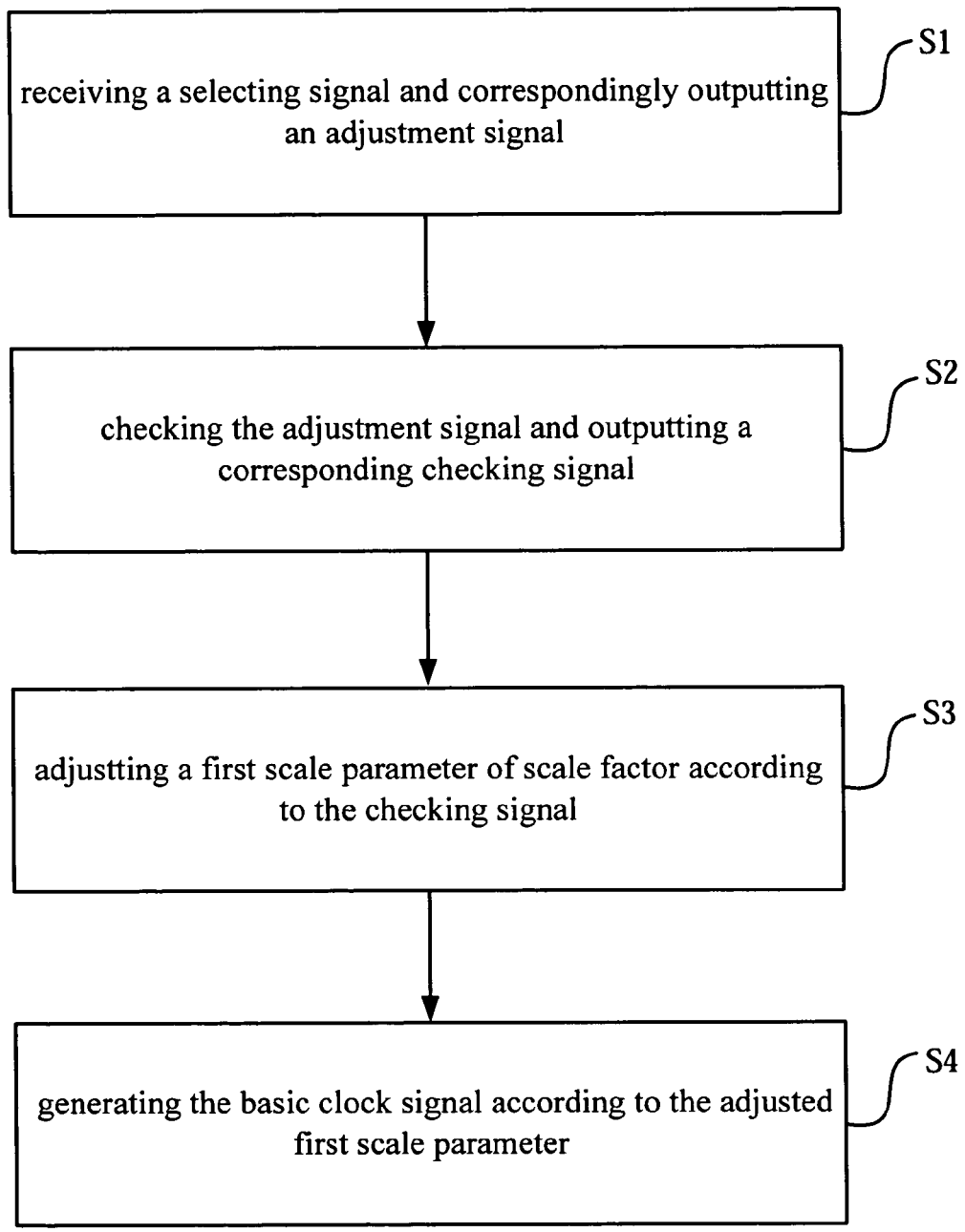
FIG. 6 is a flow chart of an embodiment in accordance with the present invention.

Refer to FIG. 6, flow char of an embodiment in accordance with the present invention is disclosed. According to the current load of the central processing unit 60, the software drives the central processing unit 60 to send a selecting signal or users inputs the selecting signal for adjusting the basic clock signal through the user interface, the bridge unit 80 receives the selecting signal and correspondingly outputs an adjustment signal for increasing/decreasing frequency, as shown in step S1. Then the check unit 56 takes the step S2, checks the received adjustment signal and outputs a corresponding checking signal. Next, the scale parameter adjustment unit 58 adjusts a first scale parameter of scale factor of the phase locked loop 52 according to the checking signal and transmits the adjusted first scale parameter to the phase locked loop 52. The first scale parameter of scale factor can be numerator or denominator of the scale factor. After receiving the fixed clock signal from the crystal oscillator 54, the phase locked loop 52 generates the basic clock signal according to the adjusted first scale parameter, as shown in step S4. Thus the frequency of the basic clock signal is modulated. Further the speed of the central processing unit 60 is adjusted so as to save electricity or increase operation efficiency.

Figure 7:
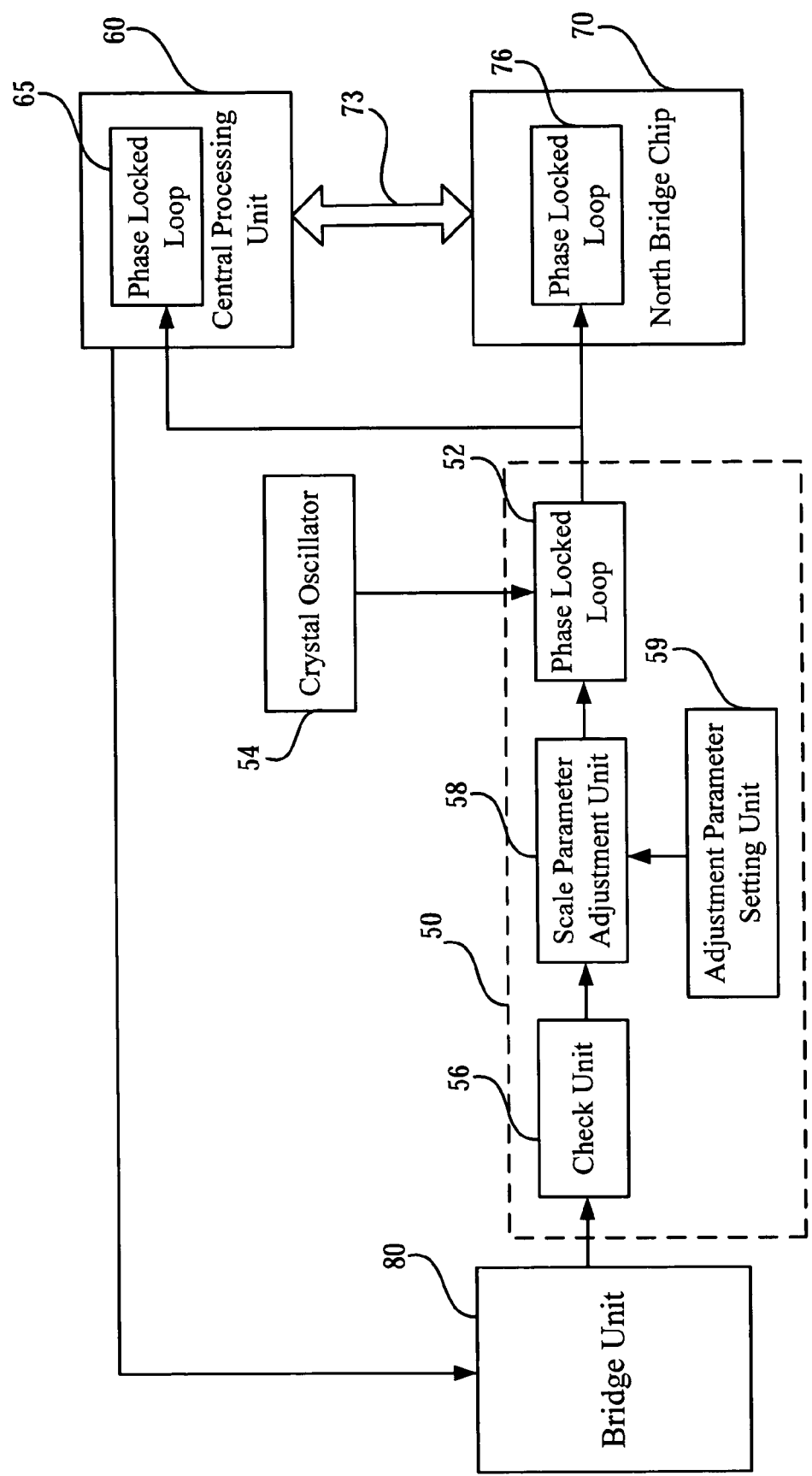
FIG. 7 is a block diagram of a further embodiment in accordance with the present invention.

Refer to FIG. 7, the difference between this embodiment and above embodiment is in that the scale parameter adjustment unit 58 is further coupled to an adjustment parameter setting unit 59. As shown in FIG. 8, the basic clock signal is divided into a plurality of sections according to frequency range and is set with maximum frequency at 120 MHz and minimum frequency at 61 MHz so as to avoid negative influence on stability of the central processing unit 60 caused by over modulation of the basic clock signal. Each section of the basic clock signal corresponds to a numerator section and each numerator section corresponds to various adjustment parameters with fixed values. According to the numerator section that the current numerator of the phase locked loop 52 corresponds, the adjustment parameter setting unit 59 outputs a corresponding adjustment parameter to the scale parameter adjustment unit 58 for subtraction or addition to the numerator used by the phase locked loop 52.

Refer to FIG. 8, it is assumed that the frequency of the basic clock signal generated by the phase locked loop 52 is 95 MHz and the numerator and dominator of the scale factor are 663.49 and 100 respectively. In order to modulate the clock signal, the adjustment parameter setting unit 59 correspondingly transmits an adjustment parameter with value of 13.97 to the scale parameter adjustment unit 58 for subtraction or addition to the current numerator (663.49) according to the numerator section (635.56~698.41) that the current numerator (663.49) of the phase locked loop 52 corresponds. It is learned from the look-up table in FIG. 8 that if the original frequency of the basic clock signal is 100 MHz, the higher or lower the adjusted frequency of the basic clock signal is, the lower the corresponding adjustment parameter is. Therefore, the frequency of the basic clock signal will not be over-modulated and the stability of the central processing unit 60 remains.

In summary, the present invention uses the bridge unit to receive the selecting signal and outputs a corresponding adjustment signal for increasing/decreasing frequency. After receiving the adjustment signal, the check unit checks and outputs the checking signal to the scale parameter adjustment unit for response. Then the scale parameter adjustment unit adjusts the numerator or denominator of the scale factor for generating the basic clock signal. According to the adjusted scale factor, the phase locked loop generates the basic clock signal so as to modulate speed of the central processing unit. While at low load, the central processing unit decreases the speed for saving electricity. When under heavy load, the central processing unit increases the speed. Therefore, the efficiency for power management is improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic adjusting circuit for adjusting a scale factor currently used by a phase locked loop to generate a basic clock signal, comprising:
    a bridge unit receiving a selecting signal and outputting a adjustment signal correspondingly;
    a check unit checking the adjustment signal for outputting a checking signal correspondingly; and
    a scale parameter adjustment unit adjusting a first scale parameter of the scale factor according to the checking signal and outputting the adjusted first scale parameter to the phase locked loop;
    wherein the phase locked loop receives a fixed clock signal and generates the basic clock signal according to the first scale parameter and a second scale parameter of the scale factor.

2. The circuit as claimed in claim 1, wherein the first scale parameter is a numerator of the scale factor and the second scale parameter is a denominator of the scale factor.

3. The circuit as claimed in claim 1, wherein the scale parameter adjustment unit adds or subtracts the first scale parameter with an adjustment parameter for adjusting the first scale parameter.

4. The circuit as claimed in claim 3, wherein the adjustment parameter is a constant.

5. The circuit as claimed in claim 3, wherein the circuit further having a adjustment parameter setting unit that provides a plurality of sections of the first scale parameter and a plurality of corresponding adjustment parameters to the scale parameter adjustment unit.

6. The circuit as claimed in claim 1, wherein the selecting signal is being sent by a software or a firmware relating to loading of a central processing unit.

7. The circuit as claimed in claim 6, wherein the software is a central processing unit driver, an operating system program or a power management program.

8. The circuit as claimed in claim 1, wherein the bridge unit is a south bridge chip.

9. The circuit as claimed in claim 1, wherein the check unit, the scale parameter adjustment unit and the phase locked loop are disposed on a clock generator.

10. The circuit as claimed in claim 1, wherein the selecting signal is being sent from a user interface.

11. The circuit as claimed in claim 10, wherein the user interface is a keyboard that includes at least one button for adjustment.

12. The circuit as claimed in claim 1, wherein the basic block signal is related to the frequency of a front side bus.

13. A method for adjusting a scale factor currently used by a phase locked loop to generate a basic clock signal, comprising the steps of:
  receiving a selecting signal and outputting a adjustment signal correspondingly;
  checking the adjustment signal and outputting a checking signal correspondingly; and
  adjusting a first scale parameter of the scale factor according to the checking signal;
  wherein the phase locked loop receives a fixed clock signal and generates the basic clock signal according to the first scale parameter and a second scale parameter of the scale factor, and the basic clock signal varies when the first scale parameter varies.

14. The method as claimed in claim 13, wherein the first scale parameter is a numerator of the scale factor and the second scale parameter is a denominator of the scale factor, the first scale parameter being greater than the second scale parameter.

15. The method as claimed in claim 13, wherein the selecting signal is generated in response to loading of a central processing unit.

16. The method as claimed in claim 15, wherein a software or a firmware is used to drive the central processing unit to generate the selecting signal.

17. The method as claimed in claim 16, wherein the software is a central processing unit driver, an operating system program or a power management program.

18. The method as claimed in claim 13, wherein the first scale parameter is adjusted by addition or subtraction of the first scale parameter and an adjustment parameter according to the checking signal.

19. The method as claimed in claim 18, wherein the adjustment parameter is a constant.

20. The method as claimed in claim 18, further comprising:
  providing a plurality of sections of the first scale parameter and a plurality of corresponding adjustment parameters for adjusting the first scale parameter.

* * * * *